United States Patent [19]

Anschel

[11] Patent Number: 5,104,734
[45] Date of Patent: Apr. 14, 1992

[54] METHOD FOR IMPROVING ADHESION BETWEEN A POLYIMIDE LAYER AND A METAL AND THE ARTICLE OBTAINED

[75] Inventor: Morris Anschel, Binghamton, N.Y.

[73] Assignee: International Business Machines Corporation, Armonk, N.Y.

[21] Appl. No.: 201,989

[22] Filed: Jun. 3, 1988

[51] Int. Cl.$^5$ .............. B32B 15/04; B32B 27/04; B05D 1/36

[52] U.S. Cl. .............. 428/336; 427/383.1; 427/404; 427/419.1; 427/419.8; 428/458; 428/473.5

[58] Field of Search .......... 428/409, 473.5, 458, 428/336; 427/383.2, 53.1, 404, 419.1, 419.8, 383.1

[56] References Cited

U.S. PATENT DOCUMENTS

| | | |
|---|---|---|
| 4,109,052 | 8/1978 | Anderson ............... 428/409 |
| 4,386,116 | 5/1983 | Nair et al. .............. 437/189 X |
| 4,508,766 | 4/1985 | Inaike et al. .......... 427/388.2 |
| 4,517,254 | 5/1985 | Grapentin et al. .... 428/473.5 X |
| 4,526,807 | 7/1985 | Auerbach ............... 427/53.1 |
| 4,598,022 | 7/1986 | Haque et al. .......... 428/473.5 X |

OTHER PUBLICATIONS

Khor, et al., "Additive Selection Criteria for Metal-Doped Polyimides", Journal of Polymer Science: Part C: Polymer Letters, vol. 25, 471-475 (1987).

*Primary Examiner*—Thomas J. Herbert, Jr.
*Attorney, Agent, or Firm*—Pollock, Vande Sande & Priddy

[57] ABSTRACT

The adhesion between a polyimide layer and a metal is improved by providing a layer of a metal benzotriazole on a polyamic acid layer wherein the metal is copper, silver, or gold. A layer of metal is then provided on the metal benzotriazole layer.

22 Claims, No Drawings

METHOD FOR IMPROVING ADHESION BETWEEN A POLYIMIDE LAYER AND A METAL AND THE ARTICLE OBTAINED

TECHNICAL FIELD

The present invention is concerned with a method for enhancing the adhesion between a polyimide layer and a metal.

In particular, the present invention is concerned with improving the adhesion between a polyimide layer and copper, silver, or gold.

The present invention is especially advantageous for the formation of conducting lines on a polyimide substrate for use in carriers for mounting integrated circuit chips.

BACKGROUND ART

Polyimides are commonly employed in the semiconductor and packaging industry.

For instance, in the packaging of semiconductor chips, polyimide films are often coated onto substrates.

For instance, in the formation of multilayer substrates for mounting chips, one configuration employs an insulating substrate of a ceramic material onto which is deposited a pattern of metallic conductors. Usually, the conductors are three layers of metal being a layer of chromium, followed by a layer of copper, followed by an overlying layer of chromium. On top of the metallized ceramic substrate is placed a layer or film of a polyimide, and on top of the polyimide a second layer of a pattern of conductors is provided.

The metal contacting the polyimide on the second or subsequent layers can be, for instance, copper as disclosed in U.S. Pat. No. 4,386,116 to Nair, et al. and assigned to International Business Machines Corporation, the assignee of the present application, disclosure of which is incorporated herein by reference.

However, the adhesion between the copper and polyimide is not entirely satisfactory and could stand a degree of improvement. In particular, problems have occurred at the copper-polyimide interface resulting in lifting up of the copper line from the underlying polyimide substrate rendering the carrier unsuitable for its intended purpose.

Accordingly, in order that the configurations which involve a copper-polyimide interface be competitive in a commercial environment, it is necessary to improve the adhesion at the copper-polyimide interface.

SUMMARY OF INVENTION

The present invention improves the adhesion at the interface of a polyimide layer and a metal such as copper, silver, or gold.

In particular, with respect to copper, the problem of line lifting is probably due to uncontrolled outgassing, diffusion, and migration of process chemicals which, in turn, lead to oxidation of the copper at the copper-polyimide interface. Examples of some chemicals employed in the processing of integrated circuit modules that would have a tendency to cause oxidation of the copper are alkaline potassium permanganate which is used as a chromium etchant, ferric chloride which is used as a copper etchant, and various chemicals used for removing resist or contaminant from within vias. It is believed that, with respect to copper, the procedures employed in the present invention tend to create a barrier to oxide formation of the copper.

In accordance with the present invention, the adhesion between a polyimide layer and metal is enhanced by providing a layer of a metal benzotriazole adjoining a polyamic acid layer. The metal of the benzotriazole is copper, silver, or gold. A layer of metal is then provided adjoining the layer of the metal benzotriazole.

In addition, the present invention is concerned with an article that comprises a polyimide layer and a layer of a metal benzotriazole above the polyimide layer. The metal of the metal benzotriazole is copper, silver, or gold. In addition, a layer of metal adjoining the metal benzotriazole layer is provided.

BEST AND VARIOUS MODES FOR CARRYING OUT INVENTION

The process of the present invention is concerned with providing a layer of a metal benzotriazole adjoining a polyamic acid layer. The metal benzotriazole can be copper benzotriazole, silver benzotriazole, or gold benzotriazole and preferably is copper benzotriazole. If desired, mixtures of these benzotriazoles can be employed.

The benzotriazole layer can be provided by applying the metal benzotriazole to the polyamic acid layer as such, preferably in a solution in an organic solvent, or preferably can be provided, for instance, by coating a layer of the polyamic acid with a thin layer of the metal; followed by coating with a solution of the benzotriazole in an organic solvent such as an alcohol, preferably methanol or ethanol, or an aromatic organic solvent such as benzene, toluene, or xylene, which, in turn, will react with the metal to form the metal benzotriazole layer. The benzotriazole layer can be provided by first coating with the benzotriazole solution, followed by the metal layer. Alternatively, the metal benzotriazole layer can be provided by simultaneously applying both the thin layer of metal and benzotriazole to the substrate.

The metal, such as copper, silver, or gold, is applied as a thin film of about 100 to about 800 angstroms such as by sputter coating or by evaporation techniques that are well-known in the art.

For instance, copper can be applied by evaporation, whereby the substrate onto which the evaporation occurs is about 220° C. to about 280° C.

The benzotriazole is usually employed as a 0.25% to about a 1% solution in the organic solvent and it can be applied by spraying or immersion coating technique. The amount is normally such as to provide a very thin layer such as about 200 to about 600 angstroms.

The polyamic acid employed is a precursor for the formation of the polyimide. Polyamic acids are commercially available such as from DuPont under the trade designation "Pyralin". Such polyimide precursors come in many grades including those available Pyralin polyimide precursors from DuPont under the further trade designations PI-2555, PI-2545, PI-2560, PI-5878, PIH-61454, and PI-2540. These particular materials are all pyromellitic dianhydride-oxydianaline (PMDA-ODA) polyimide precursors.

The polyimide precursors (polyamic acids) are converted subsequent to the step of providing the layer of the metal benzotriazole adjoining the polyamic acid to the polyimide such as by heating to elevated temperatures such as at least about 110° C. and preferably at least about 360° C. This thermal cure is usually for at least about 15 minutes and preferably at least about 30 minutes.

The polyimides employed in accordance with the present invention include unmodified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

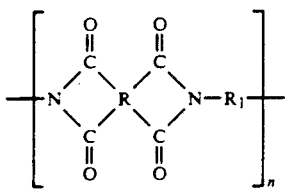

where n is an integer representing the number of repeating units to provide a molecular weight usually about 10,000 to about 100,000. R is at least one tetravalent organic radical selected from the group consisting of:

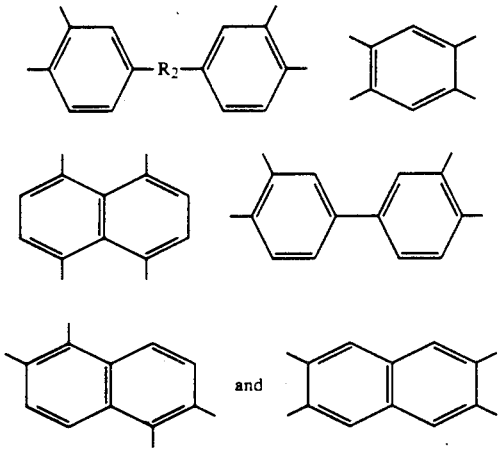

$R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

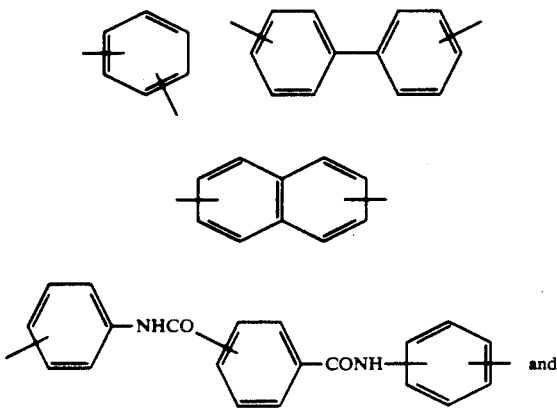 and

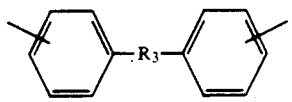

in which $R_3$ is a divalent organic radical selected from the group consisting of $R_2$, silicon, and amino radicals. Polymers containing two or more of the R and/or $R_1$ radicals, especially multiple series of $R_1$ containing amido radicals, can be used.

In the event that the polyamic acid has already been converted to a polyimide prior to the formation of the metal benzotriazole, it is preferable that only a thin layer such as about 50 angstroms to about 200 angstroms of the polyimide can be converted back to a polyamic acid such as by conversion in an aqueous alkali metal hydroxide solution usually less than about 50% concentration and preferably about 10% concentration by weight. The conversion generally takes from about 5 seconds to about 2 minutes and is carried out at normal room temperatures.

The process of the present invention further includes providing a layer of a metal adjoining the metal benzotriazole layer.

Preferably, the metal layer is copper, silver, or gold and most preferably is copper. In the most preferred aspects of the present invention, the metal layer is of the same metal as present in the metal benzotriazole. The metal layer can be provided such as by electroplating, electroless plating, or evaporation up to the desired thickness of the material. For circuitry, usually about 0.3 mils is quite adequate.

In the event only a thin layer of the polyimide is converted to polyamic acid, it will not be necessary to convert the polyamic acid back to polyimide since the bulk of the substrate will be polyimide which will be sufficient for obtaining the desired electrical and physical properties. Of course, some of the polyamic acid will inherently be converted back to the polyimide anyway, due to heat from the deposition of the metal layers.

The structure provided by the present invention can, for instance, be present on an underlying rigid support such as a ceramic substrate.

In addition, the present invention is not only applicable to structures whereby the metal benzotriazole is present on top of a polyimide layer with a metal layer on top of the metal benzotriazole, but also those structures where the metal benzotriazole is atop a metal underlying layer and the polyimide is above the metal benzotriazole.

The following non-limiting example is presented to further illustrate the present invention:

EXAMPLE

Polyimide 5878 (PMDA-ODA) substrate is immersed in a 20% aqueous sodium hydroxide solution for about 30 seconds, followed by two deionized water rinses for about 5 minutes each. The resultant sodium salt of polyamic acid is neutralized with 10% sulfuric acid.

The polyimide substrate which now contains a thin layer of polyamic acid has a layer of copper of about 400 angstroms evaporated on the polyamic acid layer at about 260° C.

The substrate is then immersed in about a 0.25% benzotriazole solution in 25% ethanol-water solvent for about 2 hours. The sample is dried and a copper film of about 800 angstroms is formed thereon by evaporation at about 260° C. Next, a layer of about 80,000 angstroms of copper is evaporated thereon, followed by about 800 angstroms of chromium evaporated at about 350° C.

The composite is subjected to a 90° tensile pull test with the results being about 16.8 grams/mm to about 25.1 grams/mm.

Having thus described our invention, what we claim as new and desire to secure by Letters Patent is:

1. An article comprising a polyimide layer and a layer of a metal benzotriazole above said polyimide layer wherein said metal is selected from the group of copper, silver, and gold, and a layer of metal adjoining said metal benzotriazole layer.

2. The article of claim 1 wherein said layer of copper benzotriazole is about 200 angstroms to about 600 angstroms.

3. The article of claim 1 wherein said metal benzotriazole is copper benzotriazole and said metal is copper.

4. The article of claim 1 wherein said layer of metal benzotriazole is adjoining said polyimide layer.

5. The article of claim 1 wherein a layer of polyamic acid is intermediate said layer of metal benzotriazole and said polyimide layer.

6. The article of claim 5 wherein the layer of polyamic acid is about 50 angstroms to about 200 angstroms thick.

7. A method for enhancing the adhesion between polyimide layer and a metal which comprises providing a layer of a metal benzotriazole adjoining a polyamic acid layer wherein said metal is selected from the group of copper, silver, and gold; providing a layer of metal adjoining said layer of metal benzotriazole and converting said polyamic acid to polyimide.

8. A method of claim 7 wherein said metal benzotriazole is copper benzotriazole and said metal is copper.

9. The method of claim 7 wherein said layer of metal benzotriazole is about 200 angstroms to about 600 angstroms.

10. The method of claim 7 wherein said layer of metal benzotriazole is provided by coating said polyamic acid with a solution of benzotriazole and with a layer of metal.

11. The method of claim 7 wherein said layer of metal benzotriazole is about 200 to about 600 angstroms.

12. The method of claim 7 wherein said layer of metal benzotriazole is provided by coating said polyamic acid with a layer of metal ad then with a solution of benzotriazole.

13. The method of claim 12 wherein said solution of benzotriazole is a solution in an alcohol or aromatic hydrocarbon.

14. A method for enhancing the adhesion between polyimide layer and a metal which comprises providing a polyimide substrate converting a layer on said substrate to polyamic acid; providing a layer of metal benzotriazole adjoining said polyamic acid, wherein said metal is selected from the group of copper, silver, and gold; providing a layer of metal adjoining said layer of metal benzotriazole.

15. The method of claim 14 wherein said metal benzotriazole is copper benzotriazole and said metal is copper.

16. The method of claim 14 wherein said polyamic acid is a layer of about 50 angstroms to about 200 angstroms thick.

17. The method of claim 14 wherein said layer of metal benzotriazole is provided by coating said polyamic acid layer with a solution of benzotriazole and then with a layer of metal.

18. The method of claim 14 wherein said polyamic acid is provided by converting polyimide by contact with an aqueous alkali metal hydroxide solution up to about 50% concentration by weight.

19. The method of claim 18 wherein said concentration is about 10% by weight.

20. The method of claim 19 wherein said alkali metal is sodium or potassium.

21. The method of claim 21 wherein said layer of metal benzotriazole is provided by coating said polyamic acid layer with a layer of metal and then with a solution of benzotriazole.

22. The method of claim 21 wherein said solution of benzotriazole is a solution in an alcohol or aromatic hydrocarbon.

* * * * *